March 29, 1966 L. J. YUSKA ET AL 3,243,660

ELECTRONIC MODULE ASSEMBLY

Filed Dec. 30, 1963

INVENTORS.
LEONARD J. YUSKA
DAVID P. ZIMMERMAN
BY H. H. Losche
Paul S. Collignon
ATT'YS.

3,243,660
Patented Mar. 29, 1966

3,243,660

ELECTRONIC MODULE ASSEMBLY

Leonard J. Yuska, Greenwood, and David P. Zimmerman, Noblesville, Ind., assignors to the United States of America as represented by the Secretary of the Navy Filed Dec. 30, 1963, Ser. No. 334,671
1 Claim. (Cl. 317—100)

The invention described herein may be manufactured and used by or for the Government of the United States of America for governmental purposes without the payment of any royalties thereon or therefor.

The present invention relates to electrical connectors and more particularly to a connector for making electrical connections to an integrated circuitry component which is formed by the deposition of thin films onto insulated substrates.

There is a constant demand for smaller electrical and electronic components, particularly in the aircraft and missile fields, as weight is of extreme importance. One concept of microelectronics which has been recently developed and which offers a great reduction in size and weight of electronic units is that of integrated circuitry which is formed on insulated bases such as glass, fused silica, or ceramic substrates. Integrated circuitry includes a number of active and passive components which are fabricated by one or more of a combination of several thin film deposition techniques onto a glass or ceramic substrate.

Present day techniques dictate that an integrated circuitry assembly be designed as a plug-in unit, and hence a socket unit for making electrical connections to the board is required. However, the small size of the assembled unit and the very thin layer of deposited films make it difficult to design an adequate connector. Heretofore, most connectors provide a sliding contact arrangement between plugs and sockets, but these cause scraping and abrading of the thin films, which soon become damaged.

One recently developed connector for printed circuit boards is shown in U.S. Patent 3,048,811, issued August 7, 1962, to Tom Lock. In this patent, a plurality of bifurcated socket contacts are provided that are made of a single length of smooth spring wire. The wire is bent to provide two resilient inwardly bowed contact portions that engage the printed circuit board. While this arrangement does permit a plurality of contacts to be mounted in a very small space, nevertheless, there is sliding contact between the wires and the connector pads on the printed circuit board.

In the present invention, a male connector is provided that has a plurality of terminal pins that are molded integral with an insulating shell. A heat sink is also molded integral with the shell. Each terminal pin has a reduced shank portion that does not exceed .010 inch in thickness and these shank portions engage the terminal contacts on the integrated circuitry components and are secured thereto by soldering. In order to facilitate assembly, a plurality of terminal pins are joined together at their ends and, after molding, the joining material is machined away so that the terminal pins become individual units.

It is therefore a general object of the present invention to provide a male connector assembly for an integrated circuitry component.

Another object of the present invention is to provide an improved method of making a connector for use with an integrated circuitry component.

Other objects and advantages of the present invention will be readily appreciated as the same becomes better understood by reference to the following detailed description when considered in connection with the accompanying drawing wherein.

Figures 1, 2, 3, 4, 5, 6:
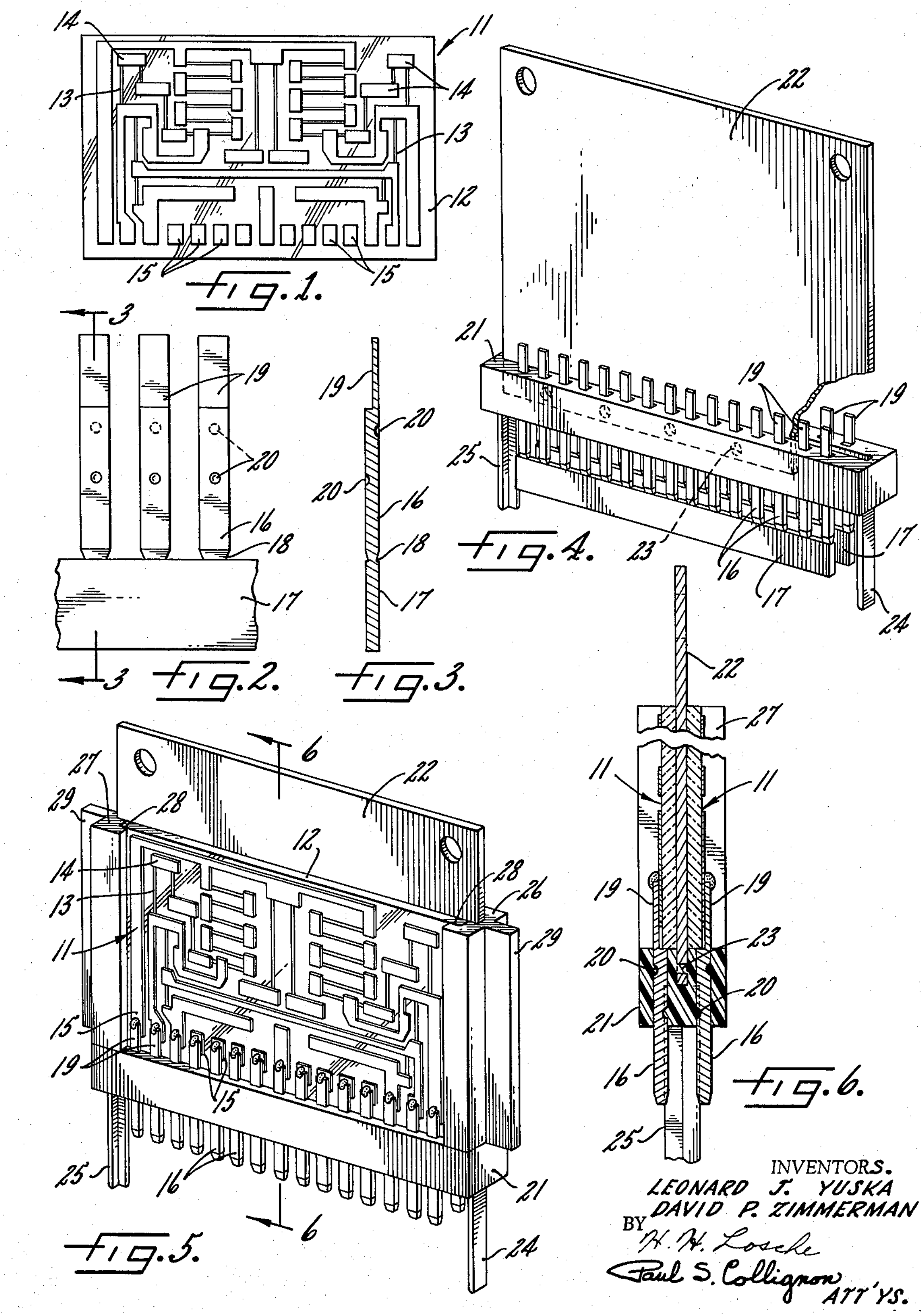
FIGURE 1 is a plan view showing a substrate having an integrated circuit deposited thereon.
FIGURE 2 is a top plan view showing a plurality of pins connected together.
FIGURE 3 is a side view of the pins shown in FIGURE 2.
FIGURE 4 is a perspective view of a connector assembly showing the plurality of pins still connected together.
FIGURE 5 is a perspective view of a complete module assembly.
FIGURE 6 is a sectional view taken on line 6—6 of FIGURE 5.

Referring now to the drawing, there is shown in FIGURE 1 an integrated circuitry component 11 comprised of a substrate 12 having electrical components, such as resistors 13 and capacitors 14 deposited thereon. The substrate can be of any suitable material, such as glass, alumina, beryllia, or barium titanate. The present state of the art of thin-film microcircuitry fabrication permits the deposition of resistors, capacitors, small inductances, and connectors. Thin solid films can be deposited onto substrates by various methods such as electrodeposition, chemical precipitation, thermal decomposition, cathodic sputtering, and high vacuum evaporation. The depositing of films by high vacuum evaporation has been particularly successful as the process is easily controlled, and the deposited films have a high degree of purity.

The various resistors, capacitors, and other components are interconnected by conducting materials, such as chromium-copper alloys or beryllium copper, and likewise the terminal contacts 15 are of good conducting materials. By way of example, the conducting materials may have a thickness of about 0.00012 inch.

Referring now to FIGURES 2 and 3 of the drawing, there is shown a plurality of terminal pins 16 that are attached together by a connecting strip 17. Each pin 16 is provided with a tapered end 18 that joins the connecting strip 17, and the other end is provided with a reduced shank portion 19 that is less than 0.010 inch in thickness. This thickness of the shank portion 19 is critical as it is necessary, in assembly, to solder these shank portions to separate terminal contacts 15 on substrate 12. In attempting to solder a heavy shank portion, that is, one that exceeds .010 inch, to a thin film, which may be about .00012 inch in thickness, various difficulties are encountered due to the large amount of heat that would be required to heat-up a heavy shank. This large amount of heat can cause the thin film to blister or break, and there is a possibility also that the substrate might crack or break. Also, when a large amount of heat is applied to a heavy shank, any expansion of the heavy shank, and subsequent contraction, might cause the thin film to be peeled from the substrate. It is therefore important that the thin films on substrates not be subjected to any more heat than is absolutely necessary. By making the shank portion 19 less than 0.010 inch, satisfactory solder joints can be made between the shank portions 19 and the terminal contacts 15. Each terminal pin 16 is provided with one or more indentations 20 to facilitate the retention of terminal pins 19 in a molded shell 21.

In FIGURE 4 of the drawing, two rows of terminal pins 16 are shown molded in a shell 21, and a metallic plate 22, which serves as a mechanical support and heat sink, is also molded therein. The reduced shank portions 19 extend above the top of shell 21 and the tapered ends 18 extend below the bottom of shell 21. Metallic plate 22, which is made of a high heat conductive material, such as aluminum, also extends above the top of shell 21 and is midway between the two rows of terminal pins.

During molding, the plastic material of shell 21 flows into the indentations 20 of the terminal pins 16 and upon solidification of the plastic material, pins 21 become "locked" in shell 21. Likewise, metallic plate 22 is provided with a plurality of holes 23 near the bottom edge, and the plastic material flows into these holes to "lock" metallic plate 22 to shell 21. After pins 19 are molded into shell 21, connecting strip 17 is cut or machined away, and pins 19 become individual units that are insulated from one another.

Pins 24 and 25, which are provided for keying purposes, are also molded into shell 21. By way of example, pins 24 and 25 may be cylindrical in nature, with a flat being provided on pin 24 and a quarter-section being removed from pin 25. A pair of guides 26 and 27 are attached to metallic plate 22, as for example by riveting, screwing, or cementing, and each guide is provided with a notch 28 on each side of the heat sink that permits an integrated circuitry component to be positioned between the metallic plate 22 and a pair of guides.

In FIGURES 5 and 6 of the drawing, there is shown a complete module assembly employing a type of connector of the present invention. Integrated circuitry components 11 are positioned adjacent metallic plate 22 and slide in notches 28 that are provided in guides 26 and 27. Terminal contacts 15 on substrate 12 are aligned with the reduced shank portions 19, and contacts 15 and portions 19 come into contact as the substrate bottoms against shell 21. Contacts 15 and portions 19 are then soldered together. Guides 26 and 27 are each provided with a flange 29 that can be used to lock the module assembly in position after the assembly is plugged into a female connector.

It can thus be seen that the present invention provides an improved connector for use with integrated circuitry components.

Obviously many modifications and variations of the present invention are possible in the light of the above teachings. It is therefore to be understood, that within the scope of the appended claim, the invention may be practiced otherwise than as specifically described.

What is claimed is:

An electronic module assembly comprising:

a shell of electrical insulating material, a plurality of terminal pins molded integral to said shell, each pin having an enlarged portion protruding through the bottom of said shell and a reduced shank portion not exceeding 0.010 inch in thickness protruding through the top of said shell, a metallic plate molded integral to said shell and extending substantially the entire length of said shell, said metallic plate extending above the ends of said reduced shank portions whereby said metallic plate functions as a mechanical support and heat sink, first and second guides attached one each to the ends of said metallic plate, said guides each having at least one notch therein and having an outwardly extending flange adaptable for mounting said module assembly, and at least one integrated circuit component having a plurality of terminal contacts thereon, said integrated circuit component being mounted in said notches of said guides and being contiguous to said metallic plate with one each of said plurality of terminal contacts contacting one each of said plurality of terminal pins.

References Cited by the Examiner

UNITED STATES PATENTS

| | | | |
|---|---|---|---|
| 2,836,772 | 5/1958 | Wintrode et al. | 317—100 X |
| 2,968,019 | 1/1961 | Steinman et al. | 317—101 |
| 3,013,186 | 12/1961 | Jones | 317—100 |
| 3,048,811 | 8/1962 | Lock | 339—176 |
| 3,080,510 | 3/1963 | Breuer | 317—100 X |
| 3,164,750 | 1/1965 | Miller | 339—112 X |
| 3,177,406 | 4/1965 | Bernstein | 317—101 |

KATHLEEN H. CLAFFY, *Primary Examiner.*

M. GINSBURG, *Assistant Examiner.*